United States Patent [19]

May et al.

[11] Patent Number: 6,117,763
[45] Date of Patent: Sep. 12, 2000

[54] METHOD OF MANUFACTURING A SEMICONDUCTOR DEVICE WITH A LOW PERMITTIVITY DIELECTRIC LAYER AND CONTAMINATION DUE TO EXPOSURE TO WATER

[75] Inventors: Charles May, Austin, Tex.; Robin Cheung, Cupertino, Calif.

[73] Assignee: Advanced Micro Devices, Inc., Sunnyvale, Calif.

[21] Appl. No.: 08/939,066

[22] Filed: Sep. 29, 1997

[51] Int. Cl.[7] .................................................. H01L 21/4763
[52] U.S. Cl. ........................ 438/622; 438/623; 438/624; 438/625; 438/628; 438/631; 438/626; 438/906
[58] Field of Search ..................................... 438/622, 623, 438/624, 625, 628, 631, 626, 906

[56] References Cited

U.S. PATENT DOCUMENTS

| | | |
|---|---|---|
| 5,212,114 | 5/1993 | Grewal et al. . |
| 5,478,436 | 12/1995 | Winebarger et al. . |
| 5,498,574 | 3/1996 | Sasaki . |
| 5,685,951 | 11/1997 | Torek et al. ........................... 156/646.1 |
| 5,789,818 | 8/1998 | Havemann ............................... 257/750 |

OTHER PUBLICATIONS

Wolf, S., *Silicon Processing for the VLSI Era*, vol. 2—Process Integration, pp. 188–217; 240–260; and 334–337; Lattice Press, Sunset Beach, California, publ. (1990); ISBN 0–961672–4–5.

Product Information Dow Corning® Flowable Oxide, Dow Corning Corporation, 8 pages (1994).

Ida, J., et al., "Reduction of wiring capacitance with new low dielectric SiOF interlayer film for high speed/low power sub–half micron CMOS", 1994 *Symposium* on VLSI Technology Digest of Technical Papers, pp. 59–60 (Jul. 6, 1994).

Jain, M. K., et al., "A novel high performance integration scheme using fluorinated–SiO/sub 2/ and hydrogen *silsesquioxane* for capacitance reduction", 1996 Proceedings Thirteenth International VLSI Multilevel Interconnection Conference (VMIC), Santa Clara, CA, Jun. 18–20, 1996; Abstract—1 page).

Jeng, S.–P., et al., "Highly porous interlayer dielectric for interconnect capacitance reduction", 1995 Symposium on VLSI Technology Digest of Technical of Technical Papers, pp. 61–62 (Jun. 6, 1995).

*Primary Examiner*—Jey Tsai
*Assistant Examiner*—Lynne A. Gurley

[57] ABSTRACT

A method of making a semiconductor device includes forming a low permittivity dielectric layer over one or more conductive lines of a semiconductor device. The dielectric layer is made using a silicon-containing material having a relatively low permittivity including, for example, silicon oxyfluoride ($SiO_yF_x$) and hydrogen silsesquioxane (HSQ). An optional oxide layer may be formed over the dielectric layer. At least a portion of the dielectric layer and/or the optional oxide layer is subsequently removed to form a planar dielectric layer having a contaminated surface layer. The contaminated surface layer is due to exposure to water and is removed by, for example, exposing the surface to an acid, such as hydrofluoric acid.

22 Claims, 4 Drawing Sheets

METHOD OF MANUFACTURING A SEMICONDUCTOR DEVICE WITH A LOW PERMITTIVITY DIELECTRIC LAYER AND CONTAMINATION DUE TO EXPOSURE TO WATER

FIELD OF THE INVENTION

The present invention is directed generally to semiconductor devices and, more particularly, to a semiconductor device having a low permittivity dielectric layer and a method of manufacturing such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

A typical semiconductor substrate includes a large number of transistors which are interconnected using one or more layers of metal. FIG. 1 illustrates an exemplary multilevel-interconnect structure for MOS technologies. The interconnect structure illustrated in FIG. 1 includes two metal layers 101, 102. Each of the metal layers 101, 102 include a plurality of metal lines 109. The first metal layer 101 generally interconnects active portions of the transistors, such as the gate electrode 105 and the source/drain region 104. Each subsequent metal layer, such as second metal layer 102, typically interconnects regions of the previously formed metal layer. Dielectric layers 106, 107 are provided between conductive structures, such as the metal layers 101, 102, the gate electrode 105, and the source/drain region 104 in order to isolate these structures from one another. Openings or vias 108 in the dielectric layers 106, 107 are used to interconnect these conductive structures as desired. A more detailed description of metal layers and the fabrication thereof may be found in S. Wolf, *Silicon Processing for the VLSI Era*, Vol. 2: Processing Integration, pp. 188–217, 240–260 and 334–337.

As noted above, semiconductor devices typically have one or more conductive layers, such as metal layers, each of which include a number of conductive lines to form an integrated circuit. Capacitance arises between conductive lines of different conductive layers ("vertical capacitance") and between adjacent conductive lines of the same conductive layer ("horizontal capacitance"). Because this capacitance can have deleterious effects on the properties of the device, a dielectric layer is provided between the conductive lines to reduce the capacitance.

One important characteristic of the dielectric layers 106, 107 in an interconnect structure is that they have a low permittivity (i.e., dielectric constant) in order to keep capacitance between conductive structures to a minimum. High capacitance between conductive structures can deleteriously affect the speed of a semiconductor device. At present, oxides having dielectric constants ranging from about 3.9 to 4.1 are used to form dielectric layers between conductive structures of a semiconductor device.

SUMMARY OF THE INVENTION

The present invention generally relates to a device formed with a dielectric material having a permittivity lower than silicon dioxide between the conductive lines and a method of manufacturing such a device. One embodiment of the invention is a method of making a semiconductor device by forming one or more conductive lines over a substrate. A low permittivity dielectric layer is formed over the conductive lines. A portion of the low permittivity dielectric layer is removed to form a planar dielectric layer. This typically results in a contaminated surface layer of the planar dielectric layer which is then removed.

In one embodiment of the invention, the contaminated surface layer is removed by contact with an acid. In another embodiment of the invention, the dielectric layer is formed with two or more sublayers.

A further embodiment of the invention is a method of making a semiconductor device, which includes forming one or more conductive lines on a substrate. A low permittivity dielectric layer is formed over the one or more conductive lines of a semiconductor device. An oxide layer is formed over the low permittivity dielectric layer. A portion of the oxide layer is removed to form a planar dielectric layer. This produces a contaminated surface layer in the planar dielectric layer which is then removed.

Another embodiment is a semiconductor device which has a substrate and one or more first conductive lines disposed on the substrate. A low permittivity dielectric layer is formed over the one or more conductive lines. The low permittivity dielectric layer includes a dielectric material having a permittivity of less than about 3.8. One or more second conductive lines are disposed over the low permittivity dielectric layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
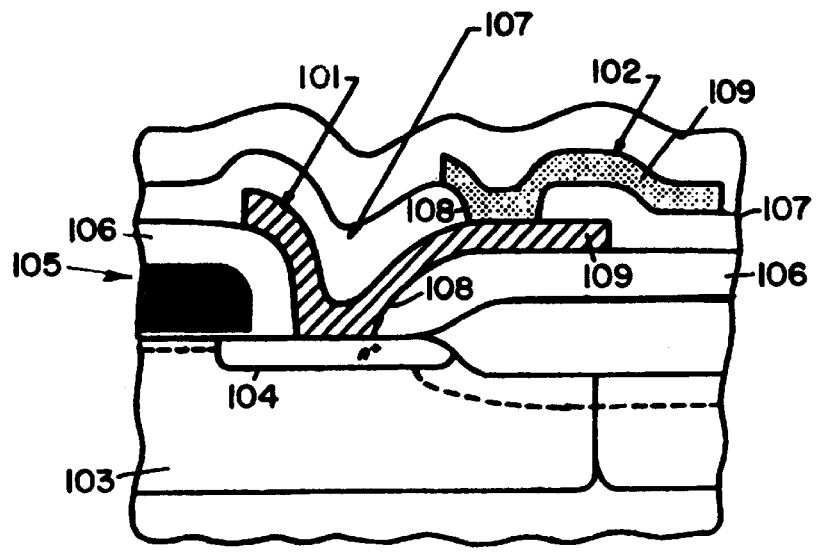
FIG. 1 illustrates an exemplary multilevel-interconnect structure for a MOS semiconductor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention generally provides a semiconductor device and method of forming a semiconductor device having a dielectric layer between conductive lines, the dielectric layer being formed with one or more relatively low permittivity materials (i.e., materials with a permittivity lower than silicon dioxide). The present invention is applicable to a number of semiconductor devices including, for example, MOS, CMOS, bipolar and BiCMOS transistors. While the present invention is not limited to such devices, an appreciation of various aspects of the invention will be gained through a discussion of various fabrication processes and device characteristics in connection with the examples provided below.

In general, the present invention is directed to forming dielectric layers from materials with relatively low permittivities (e.g., permittivities lower than the permittivity of silicon dioxide). These materials include for example, silicon oxyfluoride ($SiO_yF_x$), hydrogen silsesquioxane (HSQ), boron silsesquioxane (BSQ), and air.

Figure 2A:
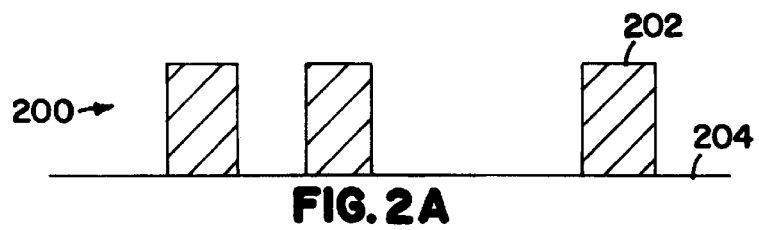
FIGS. 2A–2F illustrate an exemplary process for forming a semiconductor device in accordance with one embodiment of the present invention.

FIGS. 2A–2E illustrate an exemplary fabrication process in which a low permittivity dielectric layer is formed between conductive lines of a semiconductor device. In accordance with this embodiment, conductive lines 202 of semiconductor device 200 are formed over a wafer 204, as illustrated in FIG. 2A. The conductive lines 202 may be formed directly on top of a substrate or on top of a dielectric insulating material. Typically, the substrate is formed from silicon. However, other substrates may be used.

Usually the conductive lines 202 are formed of a metal, such as tungsten, aluminum, or copper. However, the invention is not so limited. Other conductive materials, including, for example, doped polysilicon, may be used to form the conductive lines 202. The conductive lines 202 may be formed by depositing a layer of conductive material and selectively removing portions of the conductive layer to form the conductive lines 202 using, for example, well-known deposition and etching techniques.

Figure 2B:
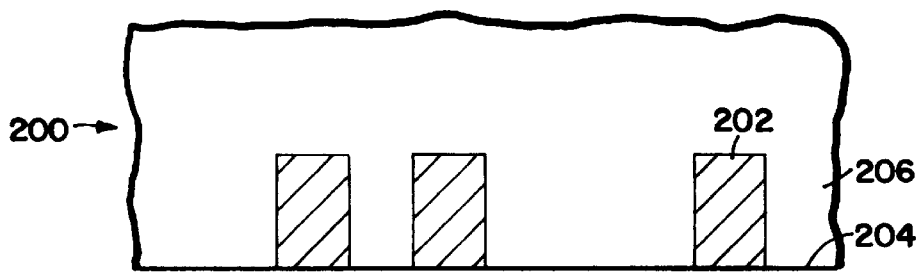
Figure 2C:
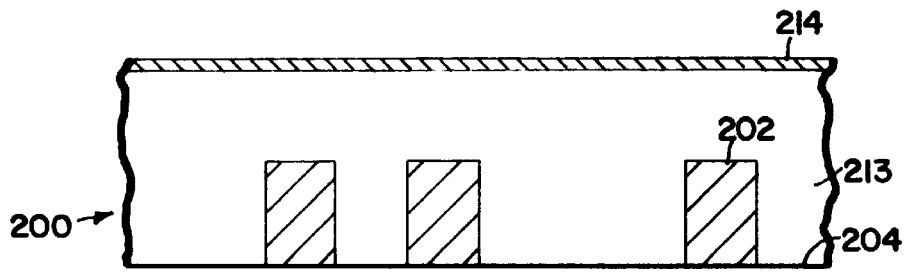

A low permittivity dielectric layer 206 is provided over the conductive lines 202, as illustrated in FIG. 2B. In some embodiments, the surface of the dielectric layer 206 is about 5,000–15,000 angstroms above the top surface of conductive lines 202. This dielectric layer 206 is formed of a material that has a permittivity lower than silicon dioxide. Typically, the material has a permittivity of less than about 3.8. Preferably, the permittivity of the dielectric material forming layer 206 is between about 2.0 and 3.5.

One suitable material for use in the low permittivity dielectric layer 206 is silicon oxyfluoride ($SiO_yF_x$). A dielectric layer 206 using this material may be formed by conventional techniques including, for example, chemical vapor deposition.

Another suitable material for forming the dielectric layer 206 is a flowable oxide-generating material, such as hydrogen silsesquioxane. This flowable oxide-generating material can flow between the conductive lines 202 to fill in the space between the conductive lines 202, thereby insulating the lines.

One exemplary method for forming a low permittivity dielectric layer 206 using a flowable oxide-generating material is to spin-on the flowable oxide-generating material. Other techniques and methods can also be used. The spin-on technology includes depositing flowable oxide-generating material on the wafer 204 and spinning the wafer 204 to spread the flowable oxide-generating material over the wafer and between the conductive lines 202 to provide a relatively uniform coverage. Generally, the flowable oxide-generating material flows either at room temperature or when heated. One particular advantage of using a flowable oxide-generating material is that the space between the conductive lines 202 can be filled with fewer voids.

A further advantage of the flowable oxide-generating material is that the planarization of a dielectric layer formed with the material typically requires fewer steps. In general, many deposition techniques, such as CVD, conformally deposit a layer of material over a surface. Thus, the resulting dielectric layer, after CVD deposition may be very uneven, with high points, corresponding generally to positions over the conductive lines 202, and low points, corresponding generally to positions between the conductive lines 202. Such uneven surfaces generally require additional steps to planarize. Using a flowable oxide-generating material prior to CVD deposition of a dielectric generates a smoother surface which is easier to planarize, because the space between the conductive lines is at least partially filled, thereby presenting a smoother surface for a subsequent CVD deposition.

After spreading, the flowable oxide-generating material is formed into an oxide dielectric. This can be accomplished by a variety of processes which may depend on the particular flowable oxide-generating material that is used. Such processes include cooling the flowable oxide-generating material; reacting the material with a compound in the ambient atmosphere or other chemical reagent; removing a solvent by processes such as evaporation; causing a chemical reaction by heating the material beyond a threshold temperature; or a combination of these techniques. Usually, the oxide is formed prior to formation of other layers, however, this is not required.

Hydrogen silsesquioxane, a flowable oxide-generating material, is commercially available form as Dow Corning® Flowable Oxide (Dow Corning, Midland, Mich.). This product flows when heated above about 200° C. Upon heating to higher temperatures (about 400–800° C.), the Dow Corning Flowable Oxide converts to an oxide glass, thereby generating a dielectric layer 206.

Figure 3:
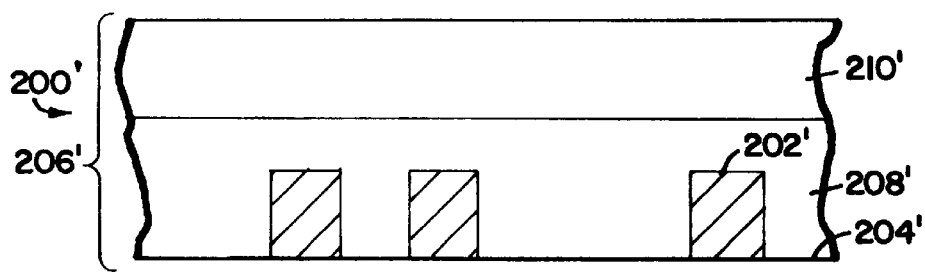
FIG. 3 is an alternate structure for the semiconductor device in FIG. 2B.

In some embodiments, a low permittivity dielectric layer 206' is formed using two or more sublayers 208', 210' as illustrated in FIG. 3. One example of a low permittivity dielectric layer 206' formed with two layers includes forming a first sublayer 208' with a flowable oxide-generating material, such as hydrogen silsesquioxane, and then forming a second sublayer 210' with a material such as silicon oxyfluoride. Typically, the flowable oxide-generating material of the first sublayer 208' at least partially fills the space between lines 202' and preferably fills all of the space between lines 202'. In some embodiments, the flowable oxide-generating material covers the conductive lines 202', as illustrated in FIG. 3. In these embodiments, the flowable oxide-generating material typically covers conductive lines 202' with less than about 1000 angstroms of material. A portion of the flowable oxide-generating material may be removed so that the material forms a relatively planar surface with conductive lines 202'.

Returning to FIGS. 2A–2E, after formation of the low permittivity dielectric layer 206, a portion of the layer 206 is removed to form a planar dielectric layer 213, as shown in FIG. 2C. The removal of the portion of the low permittivity dielectric layer 206 can be accomplished, for example, using known polishing and etching techniques, such as chemical/mechanical polishing (CMP). Such methods may include chemical etching, physical abrasion, or a combination thereof.

Typically, the techniques for removal of the portion of the low permittivity dielectric layer 206 involve water. For example, water is used as a solvent for many wet etching processes and water is often used to carry away debris from etching or abrasion processes. Furthermore, many physical abrasion processes utilize grit particles in an aqueous slurry. The water used in these processes may cause contamination of a portion 214 of the surface of the planar dielectric layer 213. The contamination may include water or materials dissolved or carried in the water stream. Furthermore, contamination may be caused by interaction of the material of the dielectric layer 206 with the water itself. For example, some halogen-containing compounds become caustic when combined with water. Contaminants typically diffuse into the dielectric layer 206. The depth and rate of diffusion depends, at least in part, on the amount and duration of exposure. Thus, exposure is preferably limited as much as possible.

Figure 2D:
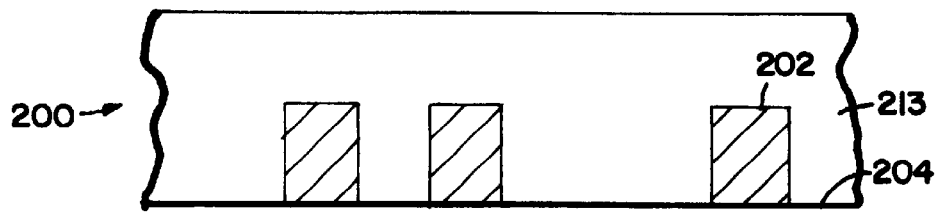

The contaminated portion 214 of the planar dielectric layer 213 is removed, as illustrated in FIG. 2D, to prevent further diffusion of contaminants into the planar dielectric layer 213 and to leave a relatively contaminant-free surface layer. A variety of techniques can be used to remove the contaminated portion 214 including, for example, contacting the contaminated portion 214 with an acid.

One example of a suitable acid for removing silicon-containing material is hydrofluoric acid (HF). Typically, the hydrofluoric acid contains water and hydrogen fluoride in a volume ratio (water:hydrogen fluoride) of between about 4:1 and about 50:1, preferably the volume ratio is between about 6:1 and about 20:1. Typically, the surface of the planar dielectric layer 213 is exposed to hydrofluoric acid for a period sufficient to remove about 100–2,000 angstroms, preferably about 400–1,200 angstroms, of dielectric material. In some cases, more or less material is removed depending on factors such as the amount of contamination and the length of time that the dielectric material was exposed to the contamination. The amount of time that the dielectric material is exposed to acid to remove the contaminated portion of the layer depends on a number of factors including, for example, the strength of the acid, the ratio of water to acid, the particular dielectric material, the nature of the contaminants, and the desired amount of dielectric that is to be removed. In some embodiments, after the planar dielectric layer 213 has been planarized and the contaminated layer 214 has been removed, the surface of planar dielectric layer 213 is between about 4,500 and 7,000 angstroms above the top surface of the conductive lines 202.

Figure 2E:
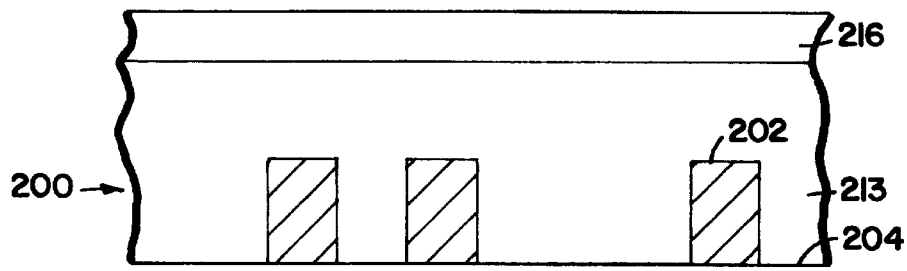

One or more second conductive lines can be formed over the planar dielectric layer 213. In some embodiments, an adhesion layer 216 is formed over the planar dielectric layer 213, as illustrated in FIG. 2E. The adhesion layer 216 is typically formed from a substance that promotes adhesion between the planar dielectric layer 213 and the second conductive lines. The adhesion layer 216 is formed by standard techniques, including, for example, chemical vapor deposition.

Figure 2F:
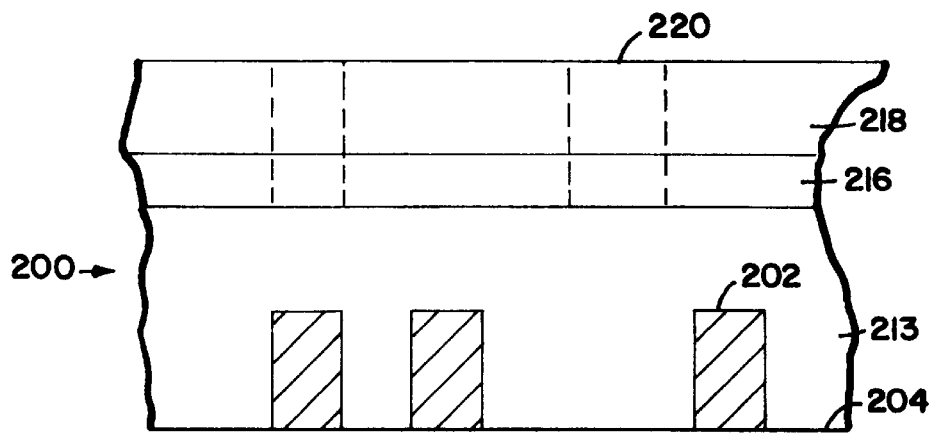

A second conductive layer 218 is formed over adhesion layer 216, as illustrated in FIG. 2F, or directly over the planar dielectric layer 213 if an adhesion layer is not used. The second conductive layer 218 is formed by standard techniques, including, for example, CVD and metallization techniques. Portions of the second conductive layer 218 and the adhesion layer 216 are removed to form a set of second conductive lines 220 using well-known methods, including, for example, patterning with a photoresist, exposing the photoresist through a resist mask, and etching the second conductive layer 218 and adhesion layer 216. Vias (not shown) may be formed through the planar dielectric layer 213 to connect the conductive lines 202, 220. The vias are made using standard techniques, including, for example, etching techniques.

The second conductive layer 218 and the conductive lines 220 can be formed from a variety of materials, including, for example, metals such as aluminum, tungsten, copper, and mixtures or alloys thereof. Suitable materials for the adhesion layer 216 may depend on the particular choice of material for the second conductive layer 218. For example, titanium, stoichiometric or nonstoichiometric titanium nitride, and combinations thereof are especially suited for use with aluminum conductive layers as they promote adhesion and may decrease electromigration of the aluminum atoms. For copper conductive layers, tantalum and tantalum compounds are useful in forming an adhesion layer.

Another exemplary process for forming a semiconductor with a low permittivity dielectric between the conductive lines is illustrated in FIGS. 4A–4H. Many of the particular steps in this process are substantially similar to those in the process exemplified in FIGS. 2A–2E. The same considerations, conditions, techniques, and materials may be used for both processes except as noted below.

Figure 4A:
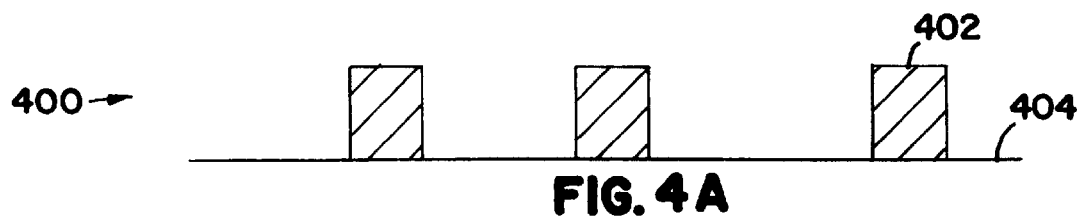
FIGS. 4A–4H illustrate another exemplary process for forming a semiconductor device in accordance with one embodiment of the present invention.
Figure 4B:
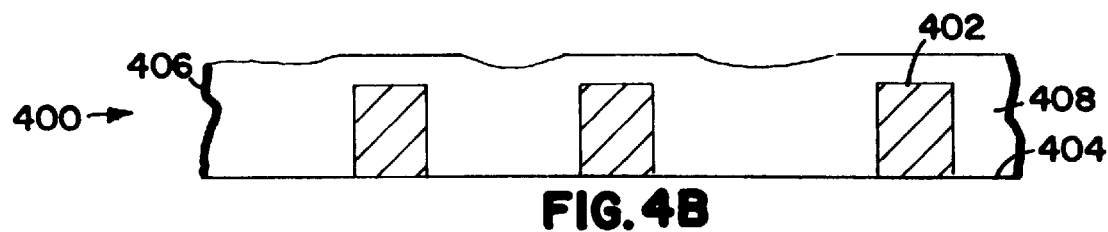
Figure 4C:
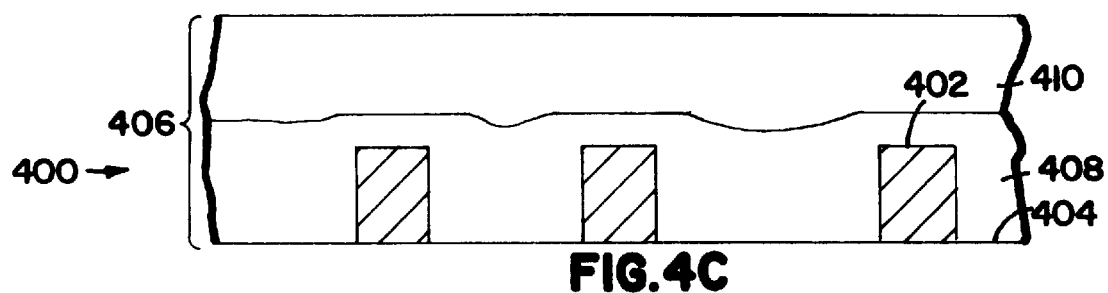

In this process, one or more conductive lines 402 are formed on a wafer 404 of a semiconductor device 400, as illustrated in FIG. 4A. A low permittivity dielectric layer 406 is formed over and between the conductive lines 402, as shown in FIGS. 4B and 4C. In the particular embodiment illustrated in FIGS. 4B and 4C, the low permittivity dielectric layer 406 includes a first sublayer 408 and a second sublayer 410. However, in some embodiments, the low permittivity dielectric layer 406 may be a single layer, similar to that illustrated in FIG. 2B. The low permittivity dielectric layer 406, whether a single layer or two or more sublayers, extends, for example, about 4000–8000 angstroms above the upper surface of the conductive lines 402.

The first and second sublayers 408, 410 are typically made using a material with a permittivity that is lower than silicon dioxide. One example of a suitable dielectric layer 406 is a first sublayer 408 made using a flowable oxide-generating material, such as hydrogen silsesquioxane, and a second sublayer 410 made using a material deposited by a CVD process, such as silicon oxyfluoride.

Figure 4D:
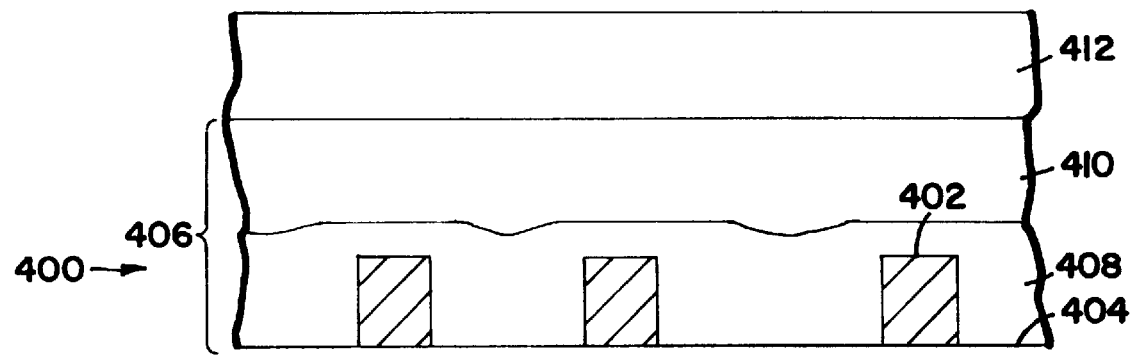

After formation of the low permittivity dielectric layer 406, an oxide layer 412 is formed over the dielectric layer 406, as illustrated in FIG. 4D. The oxide layer 412 is used to reduce the contamination of the low permittivity dielectric layer 406 during a subsequent planarization process. The oxide layer 412 is formed by standard techniques, including, for example, chemical vapor deposition. The oxide layer 412 can be made using a variety of materials. One example of a suitable material is tetraethoxy silane (TEOS) which forms a silicon dioxide layer when deposited by, for example, chemical vapor deposition. In some embodiments, the oxide layer has a thickness of about 5,000–10,000 angstroms.

Figure 4E:
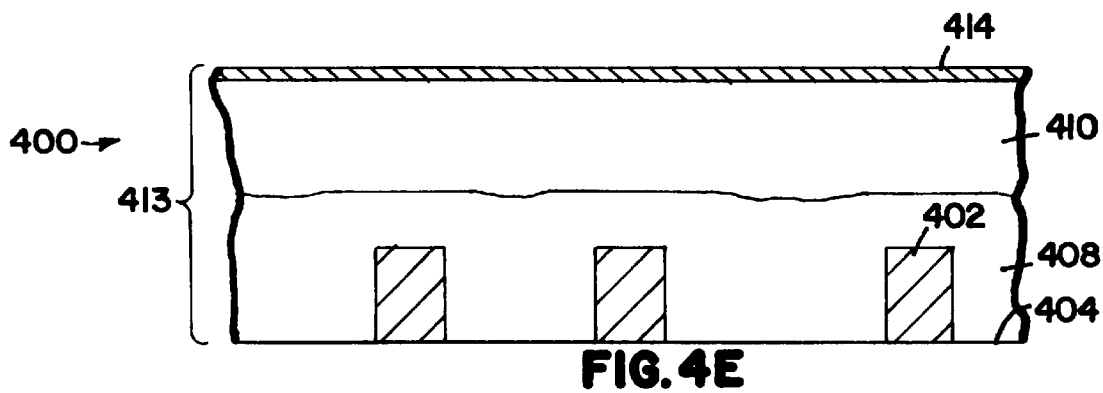

At least a portion of the oxide layer 412 is removed to form a relatively planar dielectric layer 413, as illustrated in FIG. 4E. Typically, most or all of the oxide layer 412 is removed, however, this is not required. A portion of the low permittivity dielectric layer 406 may also be removed during this process. Thus, the planar dielectric layer 413 may include all or a portion of the low permittivity dielectric layer 406 and, in some embodiments, a portion of the oxide layer 412. The removal of the oxide layer 412 can be accomplished by a variety of methods, including, for example, chemical/mechanical polishing (CMP).

Figure 4F:
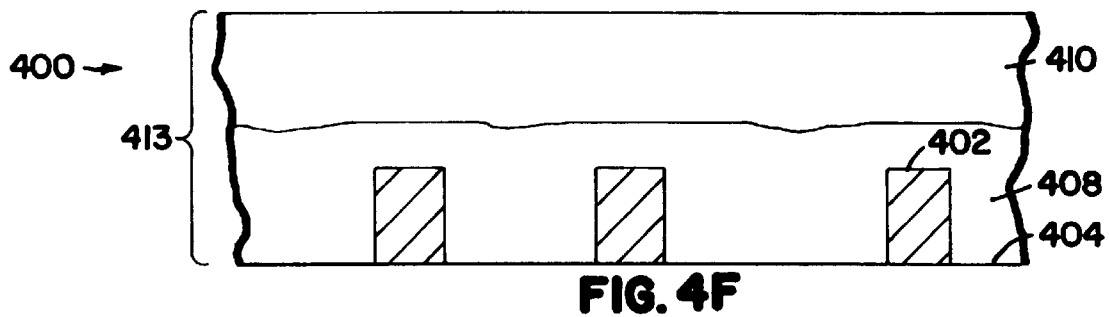

With the removal of the portion of the oxide layer 412, there is typically a small portion 414 of the planar dielectric layer 413 which is contaminated, as shown in FIG. 4E. The contaminated portion 414 of the planar dielectric layer 413 can be removed as described hereinabove. For example, the contaminated portion 414 may be removed by an acid, including, for example, an HF solution. This will typically leave a planar surface of the dielectric layer, as illustrated in FIG. 4F.

Figure 4G:
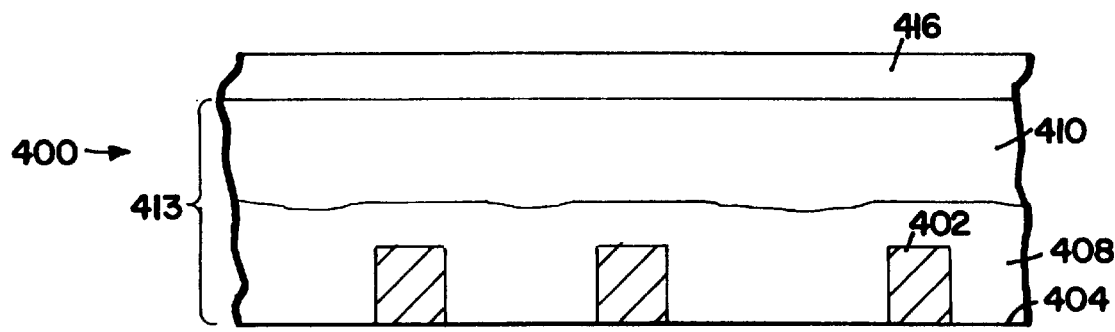
Figure 4H:
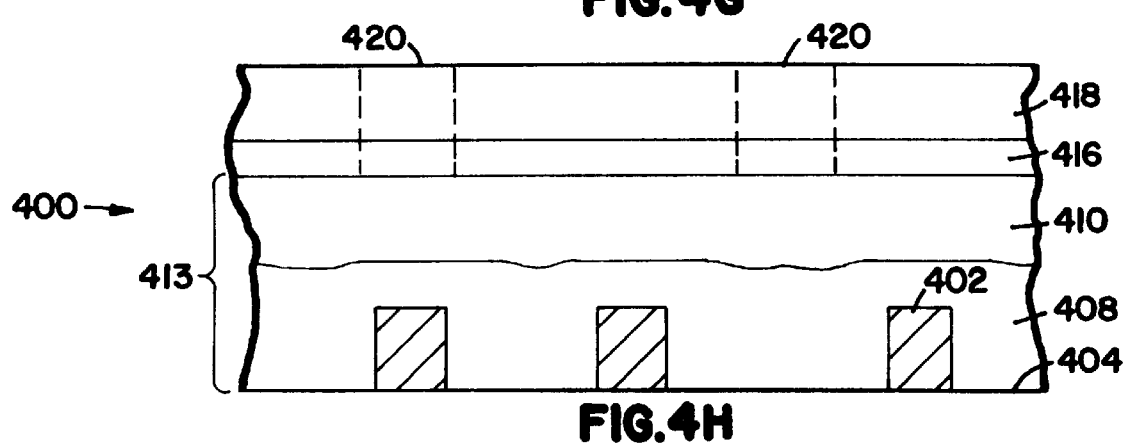

An optional adhesion layer 416 may be formed on the planar dielectric layer 413, as depicted in FIG. 4G. A conductive layer 418 is then formed over the adhesion layer 416 or, if an adhesion layer 416 is not used, directly over the planar dielectric layer 413. The conductive layer 418 is patterned using standard techniques, including, for example, photolithography, to prepare one or more second conductive lines 420, as shown in FIG. 4H. In addition, vias (not shown) can be provided through the planar dielectric layer 413 to connect the conductive lines 402 and 420.

Using the above processes, a relatively low permittivity dielectric can be disposed between conductive lines and the capacitance between conductive lines of a semiconductor device can be reduced as compared to conventional semiconductor devices using higher permittivity materials such as silicon dioxide to insulate adjacent conductive lines. This significantly enhances device performance.

It will be understood that the methods, techniques, and procedures described herein can also be used for the formation of dielectric layers, in general, and not just for dielectric layers which isolate conductive lines. Accordingly, the present invention should not be considered limited to the particular examples described above. In particular, the present invention should be understood to cover at least all of the aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of making a semiconductor device, comprising:
   forming one or more conductive lines over a substrate;
   forming a dielectric layer having a permittivity of less than about 3.8 over the conductive lines, the dielectric layer comprising a material that is contaminated by exposure to water;
   removing a portion of the dielectric layer to form a planar dielectric layer having a surface layer contaminated by exposure to water; and
   removing the surface layer contaminated by exposure to water.

2. The method of claim 1, wherein the dielectric layer comprises a material having a permittivity in the range of about 2.0 to 3.5.

3. The method of claim 1, wherein the dielectric layer comprises a silicon-containing material.

4. The method of claim 1, wherein the dielectric layer comprises a fluorine-containing material.

5. The method of claim 4, wherein the fluorine-containing material is silicon oxyfluoride.

6. The method of claim 1, wherein the dielectric layer is formed, at least in part, with a flowable oxide-generating material.

7. The method of claim 6, wherein the flowable oxide-generating material comprises hydrogen silsesquioxane.

8. The method of claim 1, wherein forming a dielectric layer comprises
   forming a first sublayer over the one or more conductive lines; and
   forming a second sublayer over the first sublayer.

9. The method of claim 1, wherein removing the surface layer contaminated by exposure to water comprises contacting the surface layer with an acid.

10. The method of claim 9, wherein the acid is hydrofluoric acid.

11. The method of claim 10, wherein the hydrofluoric acid has a volume ratio of water to hydrogen fluoride ranges from about 4:1 to about 50:1.

12. The method of claim 11, wherein the volume ratio of water to hydrogen fluoride ranges from about 6:1 to about 20:1.

13. The method of claim 1, wherein the dielectric layer is formed with a thickness between about 5,000 and 15,000 angstroms.

14. The method of claim 1, wherein the surface layer contaminated by exposure to water has a thickness between about 100 and 2,000 angstroms.

15. The method of claim 1, wherein the planar dielectric layer has a thickness between about 4,500 and 7,000 angstroms after the portion of the dielectric layer and the surface layer contaminated by exposure to water have been removed.

16. The method of claim 1, wherein the one or more conductive lines comprise a metal.

17. The method of claim 1, wherein the method further comprises forming second conductive lines over the planar dielectric layer.

18. The method of claim 17, wherein the method further comprises forming an adhesion layer between the second conductive lines and the planar dielectric layer.

19. A method of making a semiconductor device, comprising:
   forming one or more conductive lines on a substrate;
   forming a dielectric layer having a permittivity of less than about 3.8 over the one or more conductive lines of a semiconductor device, the dielectric layer comprising a material that is contaminated by exposure to water;
   forming an oxide layer over the dielectric layer;
   removing a portion of the oxide layer to form a planar dielectric layer having a surface layer contaminated by exposure to water; and
   removing the surface layer contaminated by exposure to water.

20. The method of claim 19, wherein the oxide layer comprises silicon dioxide.

21. The method of claim 19, wherein the oxide layer is formed with a thickness between about 5,000 and 10,000 angstroms.

22. The method of claim 19, wherein a portion of the dielectric layer is removed when the portion of the oxide layer is removed.

* * * * *